US008108813B2

(12) United States Patent
Boerstler et al.

(10) Patent No.: US 8,108,813 B2
(45) Date of Patent: Jan. 31, 2012

(54) STRUCTURE FOR A CIRCUIT OBTAINING DESIRED PHASE LOCKED LOOP DUTY CYCLE WITHOUT PRE-SCALER

(75) Inventors: David W. Boerstler, Round Rock, TX (US); Eskinder Hailu, Sunnyvale, CA (US); Masaaki Kaneko, Round Rock, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 800 days.

(21) Appl. No.: 12/130,040

(22) Filed: May 30, 2008

(65) Prior Publication Data

US 2009/0132971 A1 May 21, 2009

Related U.S. Application Data

(63) Continuation-in-part of application No. 11/942,983, filed on Nov. 20, 2007, now abandoned.

(51) Int. Cl.
*G06F 17/50* (2006.01)
(52) U.S. Cl. .................. 716/106; 108/132; 108/134
(58) Field of Classification Search .......... 716/106–108, 716/132–136
See application file for complete search history.

(56) References Cited

U.S. PATENT DOCUMENTS

| 4,149,111 A | 4/1979 | Coates, Jr. |
| 4,646,223 A | 2/1987 | Sekiguchi |
| 4,719,404 A | 1/1988 | Ekstrand |
| 4,970,497 A | 11/1990 | Broadwater et al. |
| 5,514,946 A | 5/1996 | Lin et al. |
| 5,517,542 A | 5/1996 | Huq |
| 5,617,016 A | 4/1997 | Borghi et al. |
| 5,757,218 A | 5/1998 | Blum |
| 5,774,704 A | 6/1998 | Williams |
| 5,838,181 A | 11/1998 | Hesterman |
| 5,883,523 A | 3/1999 | Ferland et al. |
| 5,942,947 A * | 8/1999 | Bhagwan ..................... 331/8 |

(Continued)

FOREIGN PATENT DOCUMENTS

EP    1146644 A2    10/2001

(Continued)

OTHER PUBLICATIONS

Office Action for corresponding Japanese Patent Application No. 2007-163089, dated Jul. 14, 2009, 4 pages.

(Continued)

*Primary Examiner* — Paul Dinh
(74) *Attorney, Agent, or Firm* — Stephen J. Walder, Jr.; Matthew B. Talpis (57) ABSTRACT

A design structure for a circuit for obtaining a desired phase locked loop (PLL) duty cycle without a pre-scaler is provided. The PLL circuit of the illustrative embodiments utilizes two separate loops that simultaneously operate on the VCO. One loop ensures the frequency and phase lock while the other loop ensures the duty cycle lock. The VCO is modified to have an additional control port to adjust the duty cycle. Thus, the VCO has one control port for performing frequency adjustment and one control port for duty cycle adjustment. As a result, both the duty cycle and the frequency may be controlled using the VCO of the PLL circuit of the illustrative embodiments so as to achieve any desired duty cycle output without requiring a VCO pre-scaler circuit or duty cycle correction circuit.

20 Claims, 8 Drawing Sheets

U.S. PATENT DOCUMENTS

| | | | |
|---|---|---|---|
| 6,198,317 B1 | 3/2001 | Chow et al. | |
| 6,363,507 B1 | 3/2002 | Truebenbach et al. | |
| 6,421,754 B1 | 7/2002 | Kau et al. | |
| 6,424,178 B1 | 7/2002 | Harrison | |
| 6,426,660 B1 | 7/2002 | Ho et al. | |
| 6,448,826 B1 | 9/2002 | Ooishi et al. | |
| 6,452,843 B1 | 9/2002 | Zheng et al. | |
| 6,466,071 B2 | 10/2002 | Kim et al. | |
| 6,501,313 B2 | 12/2002 | Boerstler et al. | |
| 6,509,766 B1 | 1/2003 | Pomichter et al. | |
| 6,518,809 B1 | 2/2003 | Kotra | |
| 6,535,986 B1 | 3/2003 | Rosno et al. | |
| 6,583,657 B1 | 6/2003 | Eckhardt et al. | |
| 6,600,352 B2 | 7/2003 | Miyamoto | |
| 6,680,637 B2 | 1/2004 | Seo | |
| 6,717,877 B2 | 4/2004 | Suzuki et al. | |
| 6,750,689 B2 | 6/2004 | Fletcher et al. | |
| 6,794,908 B2 | 9/2004 | Erstad | |
| 6,844,766 B2 | 1/2005 | Sun | |
| 6,850,044 B2 | 2/2005 | Hansen et al. | |
| 6,922,113 B2 | 7/2005 | Mizuno et al. | |
| 6,960,952 B2 | 11/2005 | Nguyen et al. | |
| 7,054,787 B2 | 5/2006 | Gauthier et al. | |
| 7,078,943 B2 | 7/2006 | Ho et al. | |
| 7,142,996 B2 | 11/2006 | Patel et al. | |
| 7,181,658 B2 | 2/2007 | Ito | |
| 7,225,092 B2 | 5/2007 | Boerstler et al. | |
| 7,233,186 B2 | 6/2007 | Ishimi | |
| 7,322,001 B2 | 1/2008 | Boerstler et al. | |
| 7,330,081 B1 * | 2/2008 | Asa et al. | 331/57 |
| 7,360,135 B2 | 4/2008 | Boerstler et al. | |
| 7,392,413 B2 | 6/2008 | Shikata | |
| 7,417,480 B2 | 8/2008 | Boerstler et al. | |
| 7,675,338 B2 | 3/2010 | Boerstler et al. | |
| 7,716,516 B2 | 5/2010 | Muraki et al. | |
| 2002/0075048 A1 | 6/2002 | Miyamoto | |
| 2002/0140478 A1 | 10/2002 | Fletcher et al. | |
| 2003/0112046 A1 | 6/2003 | Atallah et al. | |
| 2003/0126475 A1 | 7/2003 | Bodas | |
| 2003/0184363 A1 | 10/2003 | Lopata et al. | |
| 2004/0051509 A1 | 3/2004 | Matsuo et al. | |
| 2004/0075462 A1 | 4/2004 | Kizer et al. | |
| 2004/0108878 A1 | 6/2004 | Dosho et al. | |
| 2004/0145242 A1 | 7/2004 | Rodriguez et al. | |
| 2004/0145407 A1 | 7/2004 | Shirasawa et al. | |
| 2004/0177334 A1 * | 9/2004 | Horan et al. | 716/18 |
| 2004/0189364 A1 | 9/2004 | Lee et al. | |
| 2004/0201402 A1 | 10/2004 | Rajan et al. | |
| 2004/0232967 A1 | 11/2004 | Ishimi | |
| 2005/0007168 A1 | 1/2005 | Park et al. | |
| 2005/0043909 A1 | 2/2005 | Poirier et al. | |
| 2005/0107967 A1 | 5/2005 | Patel et al. | |
| 2005/0127958 A1 | 6/2005 | Ho et al. | |
| 2007/0079197 A1 | 4/2007 | Boerstler et al. | |
| 2007/0300082 A1 | 12/2007 | Muraki et al. | |
| 2008/0012617 A1 | 1/2008 | Boerstler et al. | |
| 2008/0229270 A1 | 9/2008 | Boerstler et al. | |
| 2008/0246524 A1 | 10/2008 | Boerstler et al. | |
| 2009/0128206 A1 | 5/2009 | Boerstler et al. | |
| 2010/0199237 A1 * | 8/2010 | Kim et al. | 716/3 |

FOREIGN PATENT DOCUMENTS

| | | |
|---|---|---|
| EP | 1139569 B1 | 12/2004 |
| JP | 10254425 A | 9/1998 |
| JP | 2001167579 A | 6/2001 |
| JP | 2001318730 A | 11/2001 |
| JP | 2004348573 A | 12/2004 |
| JP | 2005149476 A | 6/2005 |

OTHER PUBLICATIONS

Office Action for corresponding Japanese Patent Application No. 2007-163089, dated Nov. 10, 2009, 2 pages.

* cited by examiner

FIG. 13

STRUCTURE FOR A CIRCUIT OBTAINING DESIRED PHASE LOCKED LOOP DUTY CYCLE WITHOUT PRE-SCALER

BACKGROUND OF THE INVENTION

1. Field of the Invention

The present application relates generally to a design structure and more specifically, to a design structure for a phase locked loop (PLL) circuit that provides a desired duty cycle while allowing for the removal of the PLL's pre-scaler.

2. Background of the Invention

A phase locked loop (PLL) is a closed loop feedback control system that generates an output signal in relation to the frequency and phase of an input, or reference, signal. The PLL automatically responds to the frequency and phase of the input signal by raising or lowering the frequency of a controlled oscillator until it is matched to the reference in both frequency and phase. PLLs are widely used in computing devices, telecommunications systems, radio systems, and other electronic applications where it is desired to stabilize a generated signal or to detect signals in the presence of noise. Since an integrated circuit can hold a complete PLL, the use of PLLs in modern electronic devices is widespread.

Figure 1:
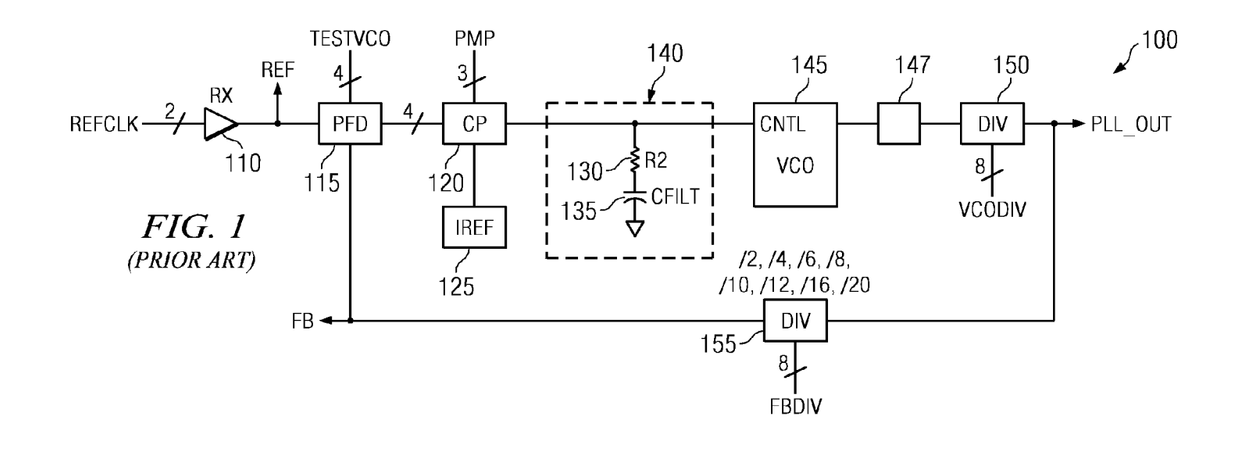
FIG. 1 is an exemplary block diagram of a conventional resistance/capacitance (RC) phase locked loop (PLL) circuit.

FIG. 1 is an exemplary block diagram of a conventional resistance/capacitance (RC) phase locked loop (PLL) circuit. As shown in FIG. 1, the conventional RC PLL circuit 100 includes a receiver (RX) 110 coupled to a phase frequency detector (PFD) 115 which is in turn coupled to a charge pump (CP) 120. A reference current signal from a reference current circuit (IREF) 125 is provided as an input to the charge pump 120 along with a control input, via a PMP bus for example, specifying the setting of the charge pump 120. The control input, which is set by a configuration register or is hard-wired into the circuit, sets the peak current for the charge pump 120. The charge pump is coupled to a resistor (R2) 130 and capacitor (CFILT) 135 which together constitute a resistance/capacitance (RC) filter 140 (also sometimes referred to as a "loop filter"). The RC filter 140 is coupled to a voltage controlled oscillator (VCO) 145 which in turn is coupled to a buffer 147 and a first divider 150. A feedback path is provided back to the input of the PFD 115 via a second divider 155.

The conventional RC PLL circuit 100 operates in a manner generally known in the art. That is, assuming the RC PLL circuit 100 is used for generating a core clock signal for a processor or other integrated circuit device, a reference clock signal is provided to the RC PLL circuit 100 via receiver 110. Preferably, the input to the receiver 110 is coupled to an external reference clock while the output of the first divider 150 is coupled to a clock input of a processor or other integrated circuit device. This reference clock signal is input to the phase frequency detector 115 which also receives as an input a feedback clock signal from the second divider 155, which divides the feedback signal from the first divider 150 by a programmable amount. The phase frequency detector 115 compares the feedback clock signal from the second divider 155 and detects a difference in phase and frequency between the reference clock signal and the feedback clock signal. The phase frequency detector 115 then generates an "up" or "down" control signal based on whether the feedback clock signal frequency is lagging or leading the reference clock signal frequency. These "up" or "down" control signals determine whether the VCO 145 needs to operate at a higher or lower frequency, respectively.

The PFD 115 outputs these "up" and "down" signals to the charge pump 120. If the charge pump 120 receives an "up" control signal, current is driven into the RC filter 140. Conversely, if the charge pump 120 receives a "down" control signal, current is drawn from the RC filter 140. The RC filter 140 converts these control signals into a control voltage that is used to bias the VCO 145. Based on the control voltage, the VCO 145 oscillates at a higher or lower frequency, which affects the phase and frequency of the feedback clock signal. If the PFD 115 produces an "up" control signal, then the VCO 145 frequency is increased. If the PFD 115 produces a "down" control signal, then the VCO 145 frequency is decreased. The VCO 145 stabilizes once the reference clock signal and the feedback clock signal have the same phase and frequency. When the reference clock signal and the feedback clock signal are aligned, the PLL circuit 100 is considered locked.

The RC filter 140 operates to filter out jitter from the charge pump 120 output and to prevent voltage over-shoot. Thus, the operation of the RC filter 140 affects the damping factor of the PLL circuit 100. The first and second dividers 150 and 155 operate to increase the VCO 145 frequency above the reference frequency of the reference clock signal. That is, the VCO 145 frequency is equal to a multiple of the reference clock signal frequency which may then be reduced by the divider circuits 150 and 155.

The first divider 150 is sometimes implemented as a divide-by-2 VCO pre-scaler circuit whose purposes is to provide a 50% duty cycle clock output signal to the processor or integrated circuit device. As is generally known in the art, a divide-by-2 VCO pre-scaler circuit provides a 50% duty cycle output signal regardless of the duty cycle of the input signal to the divide-by-2 circuit. Unfortunately, the divide-by-2 VCO pre-scaler wastes half of the available PLL frequency range. For example, in 90 nm silicon on insulator (SOI) process, the PLL has the capacity to generate frequency ranges that are in excess of 10 GHz. Setting the VCO pre-scaler to a divide-by-2 VCO pre-scaler in order to get a 50% duty cycle, essentially reduces the available frequency range by half, i.e. to 5 GHz. In current applications, such wastage is not generally a problem since most modern microprocessors have operating frequencies that are less than 5 GHz. However, for future applications, it is conceivable that all of the available frequency range would need to be exploited. Hence, it would be desirable to be able to remove the divide-by-2 VCO pre-scaler while at the same time providing a good duty cycle from the VCO.

Figure 2:
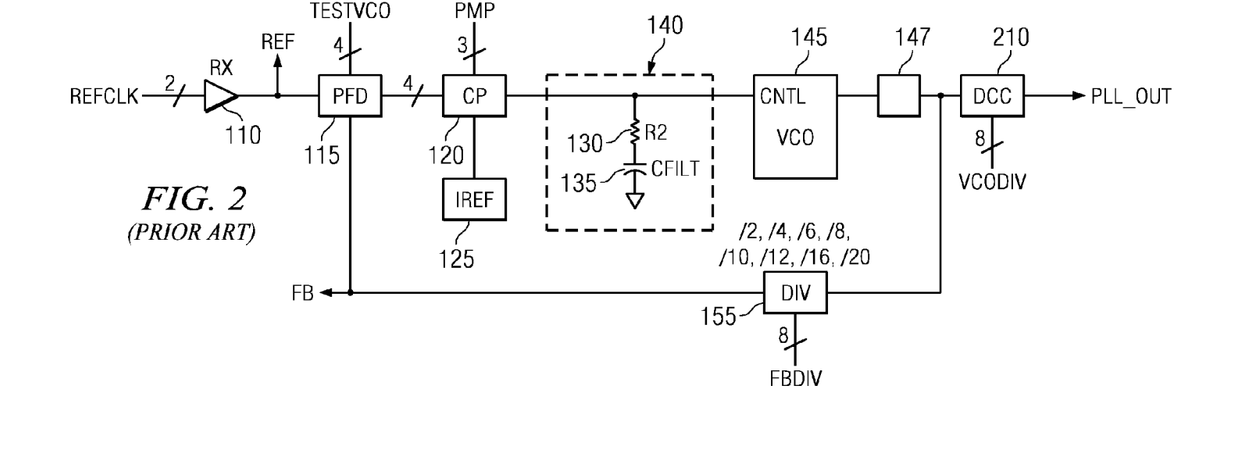
FIG. 2 is an exemplary block diagram of a conventional PLL circuit in which the VCO pre-scaler circuit is replaced with a duty cycle correction (DCC) circuit.

In some implementations of a PLL, the VCO pre-scaler is removed and a duty cycle correction (DCC) circuit is introduced at the output of the PLL. Such an example PLL is illustrated in FIG. 2. The DCC circuit 210 allows the output duty cycle of the PLL to be controlled. However, this control comes with a penalty of added latency. Furthermore, since the PLL has no control over the input to the DCC circuit 210, once the signal switch from the VCO gets below a threshold, the DCC circuit 210 will no longer be functional. Such a scenario can occur, for example, if there was process skew that made the N type field effect transistors (NFETs) of the VCO stronger than the P type field effect transistors (PFETs) of the VCO, and vice versa.

BRIEF SUMMARY OF THE INVENTION

The mechanisms of the illustrative embodiments provide a phase locked loop (PLL) circuit that provides a desired duty cycle output, such as a 50% duty cycle output, from the voltage controlled oscillator (VCO) while allowing the VCO pre-scaler circuit to be removed. The PLL circuit of the illustrative embodiments utilizes two separate loops that simultaneously operate on the VCO. One loop ensures the frequency and phase lock while the other loop ensures the duty cycle lock. To ensure stability of the system, the two loops are made very weakly dependent on each other. In doing so, the complexity of analyzing the system for stability is greatly reduced. In the event these two loops have no impact on each other, the whole system is stable if each loop is independently stable.

The VCO is modified in the PLL of the illustrative embodiments to have an additional control port to adjust the duty cycle. That is, the VCO has one control port for performing frequency adjustment and one control port for duty cycle adjustment. The devices added to the VCO to provide the additional control port for duty cycle adjustment are small enough, e.g., less than 10% of the main inverters in the loop, to have very small impact on the VCO frequency. As a result, both the duty cycle and the frequency may be controlled using the VCO of the PLL circuit of the illustrative embodiments so as to achieve any desired duty cycle output without requiring a VCO pre-scaler circuit or duty cycle correction circuit.

In one illustrative embodiment, a voltage controlled oscillator is provided that comprises a plurality of inverters, a first control port coupled to the plurality of inverters, the first control port being configured to receive a frequency control voltage, and a second control port coupled to the plurality of inverters, the second control port being configured to receive a duty cycle control voltage. A frequency of an output signal of the voltage controlled oscillator may be controlled by the frequency control voltage received via the first control port and a duty cycle of the output signal may be controlled by the duty cycle control voltage received via the second control port.

The voltage controlled oscillator may further comprise at least one duty cycle correction circuit coupled to the plurality of inverters and the second control port. The at least one duty cycle correction circuit may adjust a duty cycle of the output signal based on the duty cycle control voltage. The at least one duty cycle correction circuit may comprise a pair of transistors. The pair of transistors may adjust a pull up/down rate of at least one inverter in the plurality of inverters.

The plurality of inverters may be provided in a loop configuration having a plurality of stages. The at least one duty cycle correction circuit may comprise a plurality of duty cycle correction circuits and the duty cycle correction circuits of the plurality of duty cycle correction circuits may be coupled to every other stage of the loop.

The at least one duty cycle correction circuit may increase a size of a low pulse of the output signal and reduce a size of a high pulse of the output signal in response to an increase in the duty cycle control voltage. Moreover, the at least one duty cycle correction circuit may reduce a size of a low pulse of the output signal and increase a size of a high pulse of the output signal in response to a decrease in the duty cycle control voltage.

The frequency control voltage may be received from a low pass filter of a phase/frequency locked loop and the duty cycle control voltage is received from an operational amplifier of a duty cycle loop. The operational amplifier of the duty cycle loop may generate the duty cycle control voltage based on a desired duty cycle control signal received from a controller. The operational amplifier of the duty cycle loop may further generate the duty cycle control voltage based on an output of the phase/frequency locked loop.

In yet another illustrative embodiment, a circuit is provided that comprises a duty cycle loop and a phase/frequency loop coupled to the duty cycle loop. The duty cycle loop may provide a duty cycle control voltage to a voltage controlled oscillator of the phase/frequency loop to thereby control a duty cycle of an output signal generated by the phase/frequency loop. The phase/frequency loop may control a frequency of the output signal generated by the phase/frequency loop. The voltage controlled oscillator may comprise a plurality of inverters, a first control port coupled to the plurality of inverters, the first control port being configured to receive a frequency control voltage, and a second control port coupled to the plurality of inverters, the second control port being configured to receive the duty cycle control voltage. A frequency of an output signal of the voltage controlled oscillator may be controlled by the frequency control voltage received via the first control port and a duty cycle of the output signal may be controlled by the duty cycle control voltage received via the second control port.

In another illustrative embodiment, an integrated circuit device is provided comprising a duty cycle loop and a phase/frequency loop coupled to the duty cycle loop. The phase/frequency loop may comprise a voltage controlled oscillator and the voltage controlled oscillator may comprise a plurality of inverters, a first control port coupled to the plurality of inverters, the first control port being configured to receive a frequency control voltage from the phase/frequency loop, and a second control port coupled to the plurality of inverters, the second control port being configured to receive a duty cycle control voltage from the duty cycle loop. The duty cycle loop may provide the duty cycle control voltage to the second control port to thereby control a duty cycle of an output signal generated by the phase/frequency loop. The phase/frequency loop may control a frequency of the output signal generated by the phase/frequency loop via the first control port.

In still another illustrative embodiment, a method for controlling a duty cycle of an output signal of a voltage controlled oscillator is provided. The method may comprise receiving, in a first control port coupled to a plurality of inverters, a frequency control voltage and receiving, in a second control port coupled to the plurality of inverters, a duty cycle control voltage. The method may further comprise controlling a frequency of an output signal of the voltage controlled oscillator based on the frequency control voltage received via the first control port and controlling a duty cycle of the output signal based on the duty cycle control voltage received via the second control port. Controlling the duty cycle of the output signal may comprise adjusting, by at least one duty cycle correction circuit coupled to the plurality of inverters and the second control port, a duty cycle of the output signal based on the duty cycle control voltage.

The at least one duty cycle correction circuit may comprise a pair of transistors, and wherein the pair of transistors adjust a pull up/down rate of at least one inverter in the plurality of inverters. Moreover, the at least one duty cycle correction circuit increases a size of a low pulse of the output signal and reduces a size of a high pulse of the output signal in response to an increase in the duty cycle control voltage, and wherein the at least one duty cycle correction circuit reduces a size of a low pulse of the output signal and increases a size of a high pulse of the output signal in response to a decrease in the duty cycle control voltage.

The frequency control voltage may be received from a low pass filter of a phase/frequency locked loop and the duty cycle control voltage is received from an operational amplifier of a duty cycle loop. The operational amplifier of the duty cycle loop may generate the duty cycle control voltage based on a desired duty cycle control signal received from a controller. The operation amplifier of the duty cycle loop may further generate the duty cycle control voltage based on an output of the phase/frequency locked loop.

In another illustrative embodiment, a design structure embodied in a machine readable medium for designing, manufacturing, or testing an integrated circuit is provided. The design structure may be encoded on a machine-readable data storage medium and may comprise elements that, when processed in a computer-aided design system, generates a machine-executable representation of a phase locked loop circuit. The design structure may be a hardware description language (HDL) design structure. The design structure may comprise a netlist and may reside on a storage medium as a data format used for the exchange of layout data of integrated circuits.

In yet another illustrative embodiment, a method in a computer-aided design system for generating a functional design model of a phase locked loop circuit is provided.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

The illustrative embodiments provide a phase locked loop (PLL) that provides a desired duty cycle while allowing for the removal of the PLL's pre-scaler. Since the pre-scaler circuit is removed, the limitation on PLL frequency range found in known PLL circuit configurations is removed. That is, rather than reducing the PLL frequency range by half because of the use of a divide-by-2 VCO pre-scaler to achieve a 50% duty cycle, the PLL circuitry of the illustrative embodiments does not require a VCO pre-scaler to achieve a desired duty cycle output signal and thus, does not incur the frequency range reduction penalty. Moreover, the PLL circuit of the illustrative embodiments removes the VCO pre-scaler without requiring the introduction of a duty cycle correction (DCC) circuit. Thus, the PLL circuit of the illustrative embodiments does not suffer from the latency associated with DCC circuits.

Figure 3:
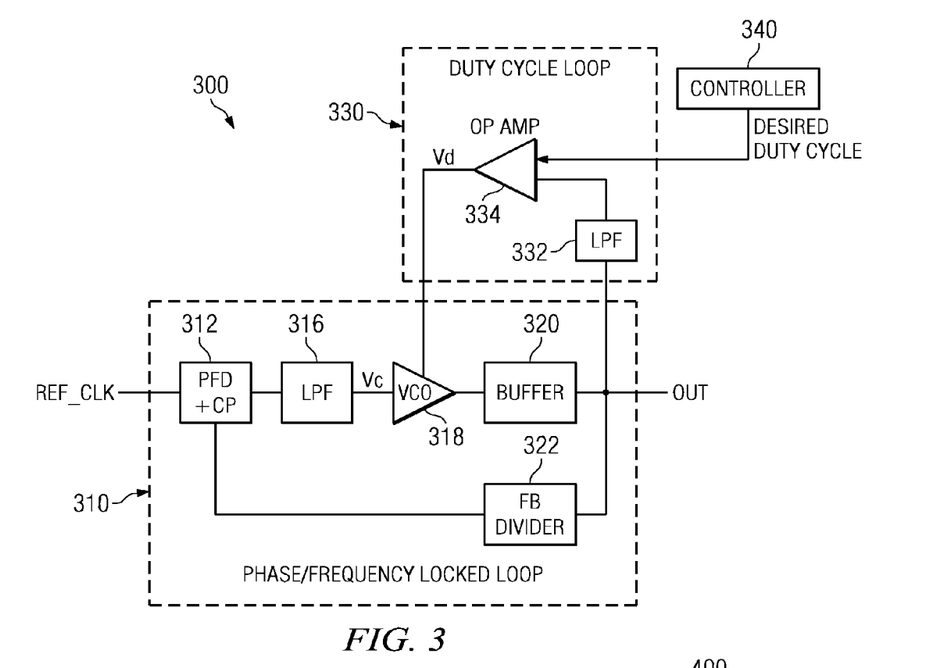
FIG. 3 is an exemplary block diagram of a PLL circuit in accordance with one illustrative embodiment.

FIG. 3 is an exemplary diagram illustrating a PLL circuit in accordance with one illustrative embodiment. As shown in FIG. 3, the PLL circuit 300 comprises a first loop 310, referred to as the phase/frequency locked loop 310, that is used to control the frequency/phase of the output signal OUT, and a second loop 330, referred to as the duty cycle loop 330, which is used to control the duty cycle of the output signal OUT. The phase/frequency locked loop 310 is similar to a conventional PLL in that it includes a pulse/frequency detector (PFD) and charge pump 312, a low pass filter (LPF) 316 coupled to the charge pump 312, a voltage controlled oscillator (VCO) 318 coupled to the LPF 316, a buffer 320 coupled to the VCO 318, and a feedback divider 322 in a feedback loop from the buffer 320 to an input of the PFD charge pump 312. The phase/frequency locked loop 310 operates in much the same manner as discussed above with regard to the conventional PLL with regard to the control of the phase/frequency of the output signal OUT.

The duty cycle loop 330 is comprised of a low pass filter 332 coupled to the output of the buffer 320 of the phase/frequency locked loop 310. The low pass filter 332 provides an output to the op-amp 334. The op-amp 334 further receives as an input, a voltage corresponding to the desired duty cycle setting for the output signal OUT. The op-amp 334 then provides an input to the VCO 318 of the phase/frequency locked loop 310.

The VCO 318 of the phase/frequency locked loop 310 is not a conventional VCO 318 but rather a modified VCO 318, in accordance with the illustrative embodiments, that provides an additional control port for controlling the duty cycle of the output of the VCO 318. The control port receives the output of the op-amp 334 which in turn controls the duty cycle of the output generated by the VCO 318.

The voltage corresponding to the desired duty cycle setting for the output signal may be determined and generated by a controller 340 coupled to the duty cycle loop 330. The controller 340 may be programmed with corresponding voltage levels as will be described in greater detail hereafter. The frequency of the output of the VCO 318 is virtually independent of the voltage from the op-amp 334, due to a weak dependency of the two loops 310 and 330, Thus, a first control voltage may be provided to the VCO 318 to control the frequency of the output signal and a second control voltage may be provided to the VCO 318 from the op-amp 334 to control the duty cycle of the output signal with largely no change in the frequency of the output signal from that specified by the first control voltage.

Figure 4A:
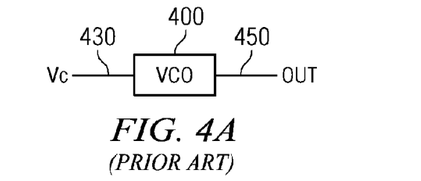
FIGS. 4A and 4B are exemplary diagrams of a known VCO circuit.
Figure 4B:
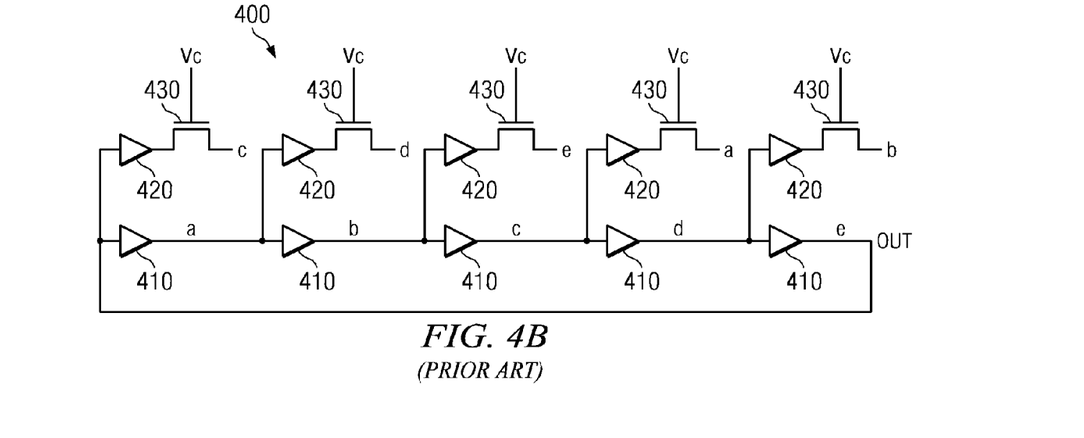

FIGS. 4A and 4B are exemplary diagrams of a known VCO circuit 400. As shown in FIGS. 4A and 4B, the known VCO circuit 400 is comprised of a first set of inverters 410 coupled in series, a second set of inverters 420 having a plurality of inverters, each of which is coupled in parallel to one of the inverters in the first set of inverters 410. Each inverter in the second set of inverters 420 is further coupled to an input control port 430.

The VCO circuit 400 operates by varying the delay for a signal to propagate around the loop comprising the first set of inverters 410. This delay is controlled by the control voltage Vc. The higher the control voltage Vc, the shorter the propagation delay and hence, the higher the frequency. The multiple Vc inputs allow for the signal propagation delay from any node (i.e. nodes a, b, c, d, and e) to be adjustable. It should be noted that the outputs of the inverters 410 are also labeled a, b, c, d, and e to indicate that nodes that have the same label are shorted when a corresponding control voltage Vc is input to a corresponding input control port 430. Thus, the control voltage Vc input to the input control port 430 is used to control the frequency of the output of the VCO circuit 400 at the output port 450.

Figure 5A:
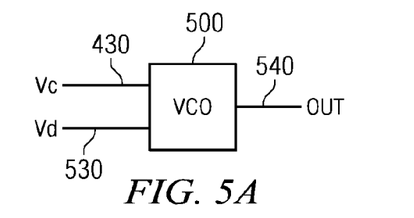
FIGS. 5A and 5B are exemplary diagrams of a VCO circuit in accordance with one illustrative embodiment.
Figure 5B:
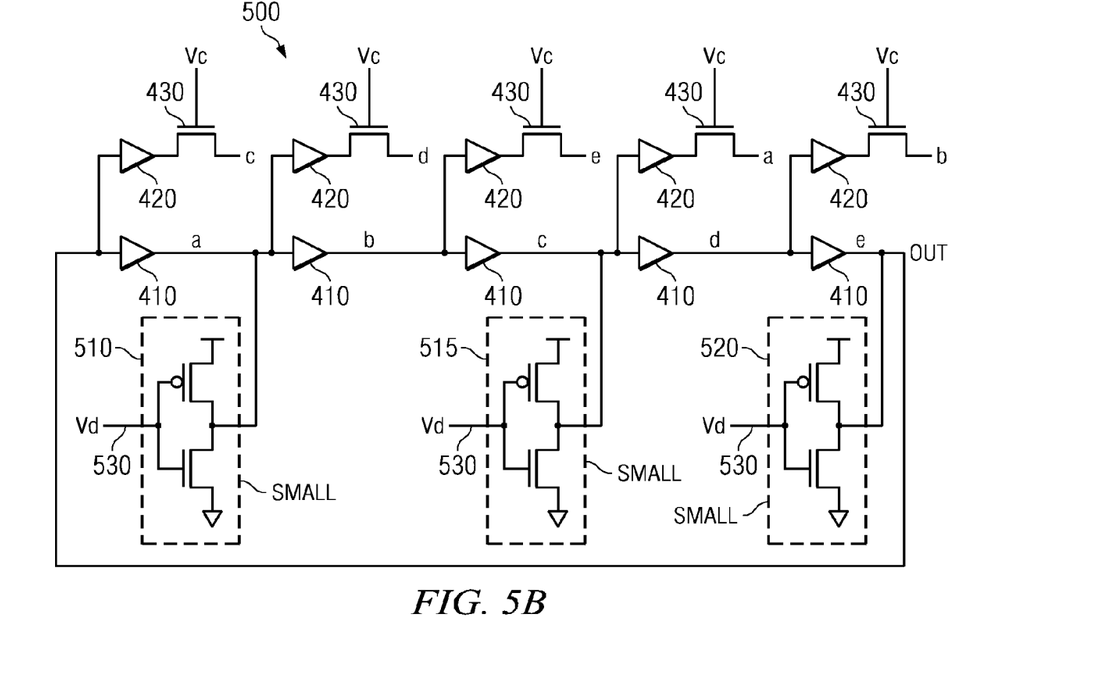

FIGS. 5A and 5B are exemplary diagrams of a VCO circuit in accordance with one illustrative embodiment. As shown in FIGS. 5A and 5B, the modified VCO circuit 500 of the illustrative embodiments comprises the same Vc input control port 430 as the known VCO circuit 400 but also includes an additional input control port 530 for receiving a control voltage Vd. The control voltage Vd is provided for controlling the duty cycle of the output signal generated at the output port 540 of the VCO circuit 500.

As shown in FIG. 5B, the input control voltage Vd is provided to three duty cycle correction circuits 510-520, comprising a pair of transistors, which are coupled to the first series of inverters 410. The additional devices, i.e. the duty cycle correction circuits 510-520, are relatively small, e.g., less than 10% of the main inverters 410 and 420 in the loop, and as a result, have very small impact on the frequency of the output signal of the VCO circuit 500.

Generally, the duty cycle correction circuits 510-520 are inserted every other stage of the VCO circuit 500. Thus, in the 5 stage ring oscillator illustrated in FIG. 5B, there are only three duty cycle correction circuits 510-520. However, the illustrative embodiments are not limited to a 5 stage oscillator or having three duty cycle correction circuits 510-520. For example, in other implementations other numbers of stages and numbers of duty cycle correction circuits may be used without departing from the spirit and scope of the present invention. For example, if a 9 stage ring oscillator is utilized, then 7 duty cycle correction circuits would be included. The pair of transistors in the duty cycle correction circuits 510-520 operate by adjusting the pull up/down rate of the inverters 410 (i.e. the rate at which the inverter 410 pulls to vdd or to ground). When Vd is higher, the pull down rate of nodes a, c, and e is higher. This means that the signal at these nodes will have wider low and narrow high pulses. Due to inversion, the signals at nodes b and d will have wider high pulses and narrower low pulses. When Vd is lower, the above affects are reversed, i.e. nodes a, c, and e will have wider high pulses and narrower low pulses, while nodes b and d will have narrower high pulses and wider low pulses. Thus, the duty cycle correction circuits 510-520 increase a size of a low pulse of the output signal and reduce a size of a high pulse of the output signal in response to an increase in the duty cycle control voltage Vd. Moreover, the duty cycle correction circuits 510-520 reduce a size of a low pulse of the output signal and increase a size of a high pulse of the output signal in response to a decrease in the duty cycle control voltage Vd. As a result, by varying the duty cycle control voltage Vd, different duty cycles may be achieved by adjusting the size of high and low pulses of the input signal.

Figure 6:
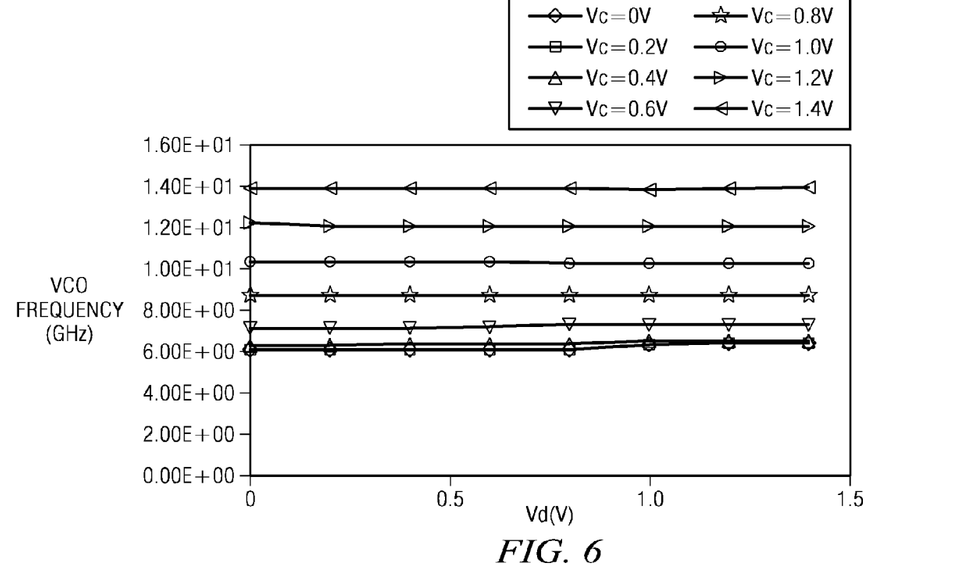
FIG. 6 is an exemplary diagram illustrating a sensitivity of the VCO's output signal frequency to variations in the duty cycle control voltage Vd in accordance with one illustrative embodiment.

The operation of the modified VCO circuit 500 will now be described in terms of simulations of the VCO circuit 500. In a first simulation, for a given frequency control voltage Vc, the duty cycle control voltage Vd was swept through its possible settings and the frequency of the output signal of the VCO circuit 500 was observed. The purpose of this simulation was to see how much sensitivity the output signal's frequency shows to variations in the duty cycle control voltage Vd. The results are shown in FIG. 6. As shown in FIG. 6, for each Vc, the frequency of the output signal of the VCO circuit 500 did not change appreciably as the duty cycle control voltage Vd was changed. Thus, the frequency of the output signal of the VCO circuit 500 of the illustrative embodiments is relatively independent of the duty cycle control voltage Vd.

Figure 7:
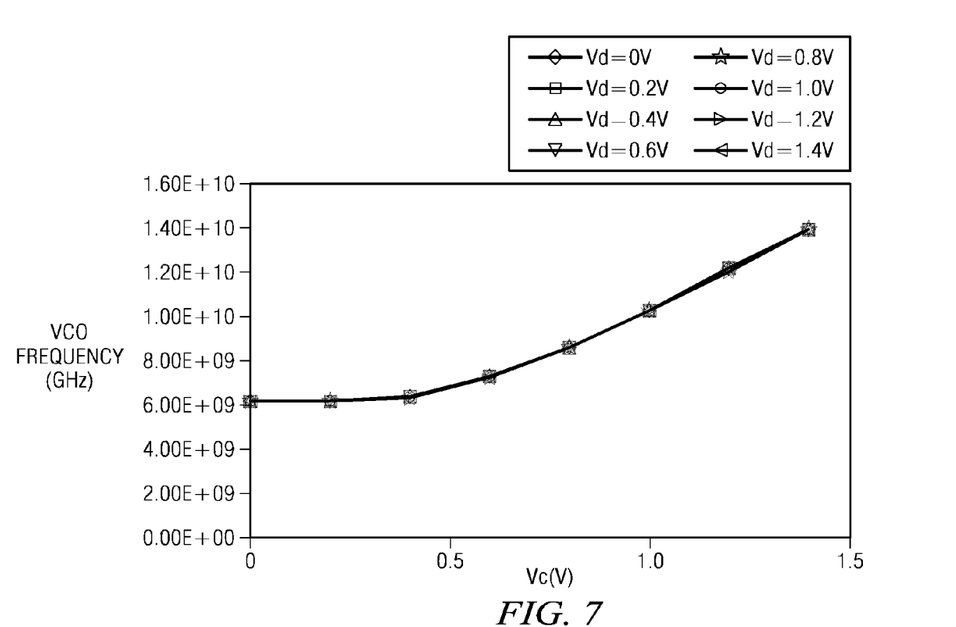
FIG. 7 is an exemplary diagram of the VCO output frequency as a function of the frequency control voltage Vc for a fixed duty cycle control voltage Vd in accordance with one illustrative embodiment.
Figure 8:
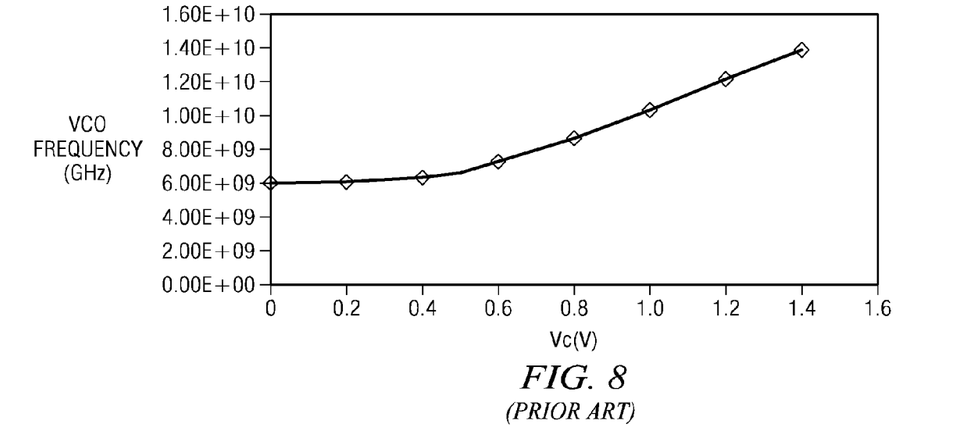
FIG. 8 is an exemplary diagram illustrating a plot of VCO output frequency for a known VCO circuit as a function of the frequency control voltage Vc.

FIG. 7 is a plot of the VCO circuit 500 output frequency as a function of the frequency control voltage Vc for a fixed duty cycle control voltage Vd. As shown in FIG. 7, the output frequency of the VCO circuit 500 is basically the same for each duty cycle control voltage Vd as the frequency control voltage Vc is increased. That is, the curves are the same for each setting of duty cycle control voltage Vd. Moreover, FIG. 8 illustrates a plot of VCO circuit 400 output frequency for the known VCO circuit, as a function of the frequency control voltage Vc. It can be seen from a comparison of FIGS. 7 and 8 that the output frequency of the modified VCO circuit 500 of the illustrative embodiments is essentially the same as that for the known VCO circuit 400.

Thus, the modified VCO circuit 500 of the illustrative embodiments achieves a similar frequency control as the known VCO circuit 400. Moreover, it is shown that the VCO circuit's output frequency has very little dependence on the duty cycle control voltage Vd, i.e. it is substantially independent of the duty cycle control voltage Vd. This is a highly desirable property since it allows the duty cycle of the output signal of the VCO circuit 500 to be controlled independently of the frequency of the output signal.

In a second simulation, for a given frequency control voltage Vc, the duty cycle of the output signal of the VCO circuit 500 is measured as a function of the duty cycle control voltage Vd. The purpose of this simulation is to see the duty cycle of the VCO circuit 500 as a function of the duty cycle control voltage Vd. The results of this simulation are shown in FIG. 9.

Figure 9:
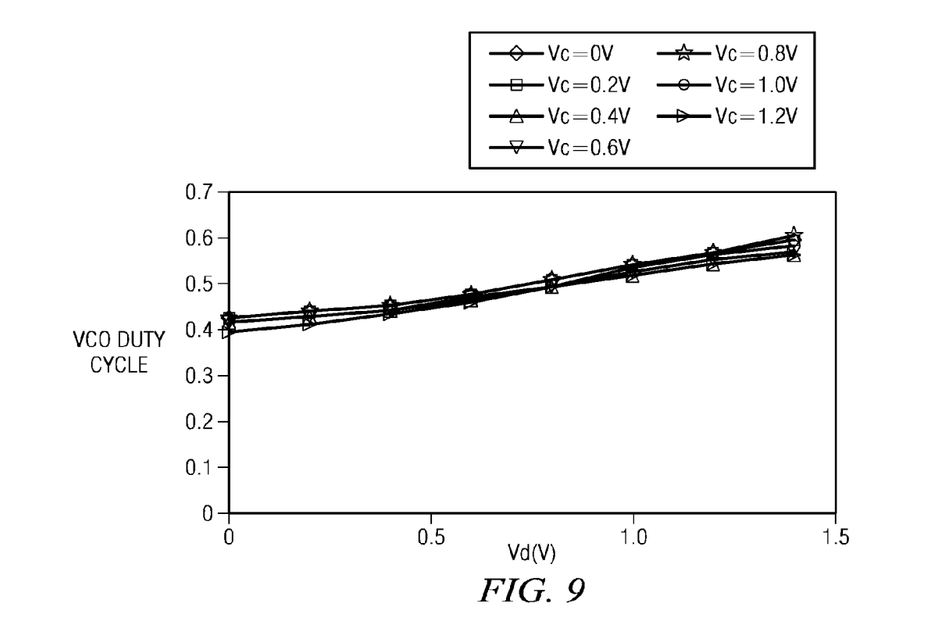
FIG. 9 is an exemplary diagram illustrating the duty cycle of the VCO as a function of the duty cycle control voltage Vd in accordance with one illustrative embodiment.
Figure 10:
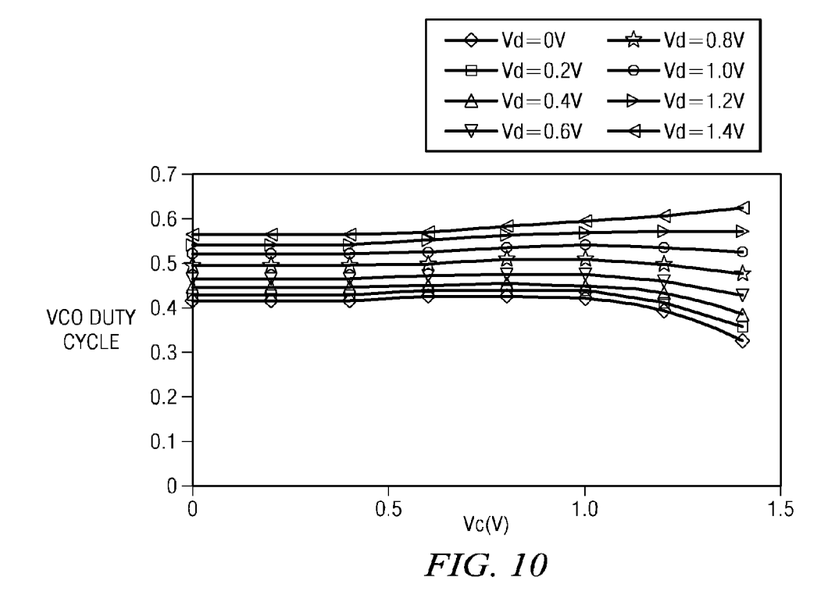
FIG. 10 is an exemplary diagram illustrating the relative insensitivity of the duty cycle of the output signal of the VCO to the frequency control voltage Vc for a fixed duty cycle control voltage Vd in accordance with one illustrative embodiment.

As shown in FIG. 9, the duty cycle of the output signal of the VCO circuit 500 is virtually independent of the frequency control voltage Vc, i.e. the curve is essentially the same for every selection of Vc. Moreover, as the duty cycle control voltage Vd increases, so does the duty cycle of the output signal of the VCO circuit 500. A 50% duty cycle output signal is achieved at a duty cycle control voltage Vd of approximately 0.75 V. To further show the relative insensitivity of the duty cycle of the output signal of the VCO circuit 500 to the frequency control voltage Vc, the VCO circuit 500 output signal duty cycle is plotted as a function of the frequency control voltage Vc for a fixed duty cycle control voltage Vd, as shown in FIG. 10. From FIG. 10 it can be seen that the duty cycle of the VCO circuit 500 shows a weak dependence on the frequency control voltage Vc at high Vc values, i.e. high frequency values.

From the plots in FIGS. 7-10, it can be seen that, for a given Vd, the VCO circuit 500 output signal frequency is monotonic with respect to Vc. Similarly, for a given Vc, the VCO circuit 500 output signal duty cycle is monotonic with respect to Vd. This is important for ensuring a single stable operating point for the VCO circuit 500 loop.

The plots shown in FIGS. 7-10 may be encoded in a controller, such as controller 340 in FIG. 3, so that for a desired frequency and duty cycle, appropriate control voltages Vc and Vd may be generated and input to the VCO circuit 500 to cause the PLL to generate a desired output signal to a processor or integrated circuit device. For example, for a desired VCO circuit output signal frequency F, there is a corresponding control voltage Vc as may be determined from the plot shown in FIG. 7 above. Once Vc is known, the controller may select a desired duty cycle by using the plot shown in FIG. 10. In FIG. 10, a vertical line may be drawn at a specific Vc. The controller may select any point on this vertical line to select the desired VCO output duty cycle.

Thus, the illustrative embodiments provide a novel phase and duty cycle locked loop. This circuit allows the control of phase/frequency and duty cycle of a VCO. In doing so, the divide-by-2 pre-scaler circuit that follows the VCO in known PLL designs may be removed to thereby double the available frequency bandwidth of the PLL.

Figure 11:
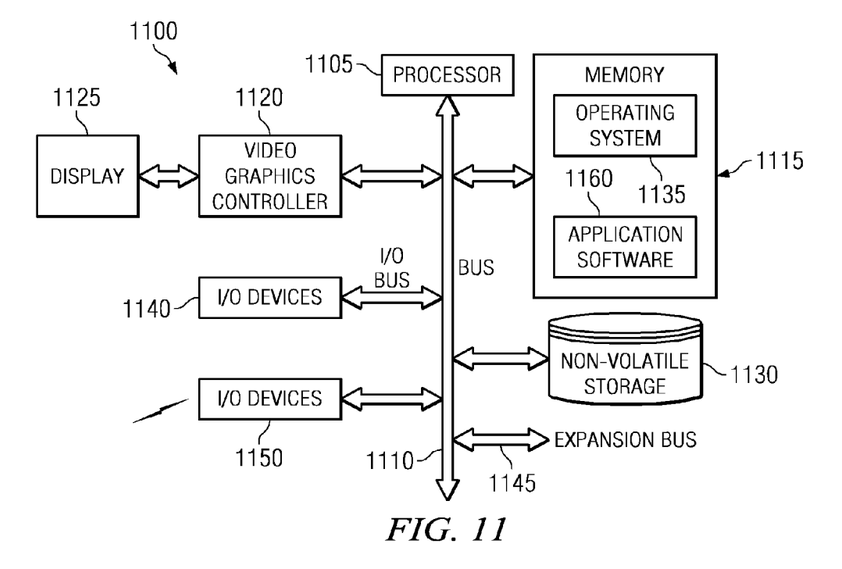
FIG. 11 is an exemplary diagram of an information handling system in accordance with one illustrative embodiment.

FIG. 11 shows an information handling system (IHS) 1100 that employs an integrated circuit in which the PLL circuit 300 of FIG. 3, and the modified VCO of FIGS. 5A and FIG. 5B, may be provided as part of a processor 1105 for the IHS. In this example, processor 1105 includes the functional blocks (not shown) typically associated with a processor such an instruction decoder, execution units, load/store units as well as other functional units. The computing device/controller (not shown in FIG. 11) may be coupled to the integrated circuit processor 1105 to perform the duty cycle measurements described above using the DCM apparatus which may be provided in one or more locations of the processor 1105.

IHS 1100 further includes a bus 1110 that couples processor 1105 to system memory 1115 and video graphics controller 1120. A display 1125 couples to video graphics controller 1120. Non-volatile storage 1130, such as a hard disk drive, CD drive, DVD drive, or other non-volatile storage couples to bus 1110 to provide IHS 1100 with permanent storage of information. An operating system 1135 loads in memory 1115 to govern the operation of IHS 1100, such as running of application software 1160. I/O devices 1140, such as a keyboard and a mouse pointing device, are coupled to bus 1110. One or more expansion busses 1145, such as USB, IEEE 1394 bus, ATA, SATA, PCI, PCIE and other busses, are also coupled to bus 1110 to facilitate the connection of peripherals and devices to IHS 1100. A network adapter, which may be considered one of the I/O devices 1150, may be coupled to bus 1110 to enable IHS 1100 to connect by wire or wireless link to a network and/or other information handling systems.

While FIG. 11 shows one IHS 1100 that employs processor 1105, the IHS 1100 may take many other forms. For example, IHS 1100 may take the form of a desktop, server, portable, laptop, notebook, or other form factor computer or data processing system. IHS 1100 may take other form factors such as a gaming device, a personal digital assistant (PDA), a portable telephone device, a communication device or other devices that include a processor and memory. While IHS 1100 of FIG. 11 is described as an information handling system, controller 340 of FIG. 3 is itself a form of information handling system.

Figure 12:
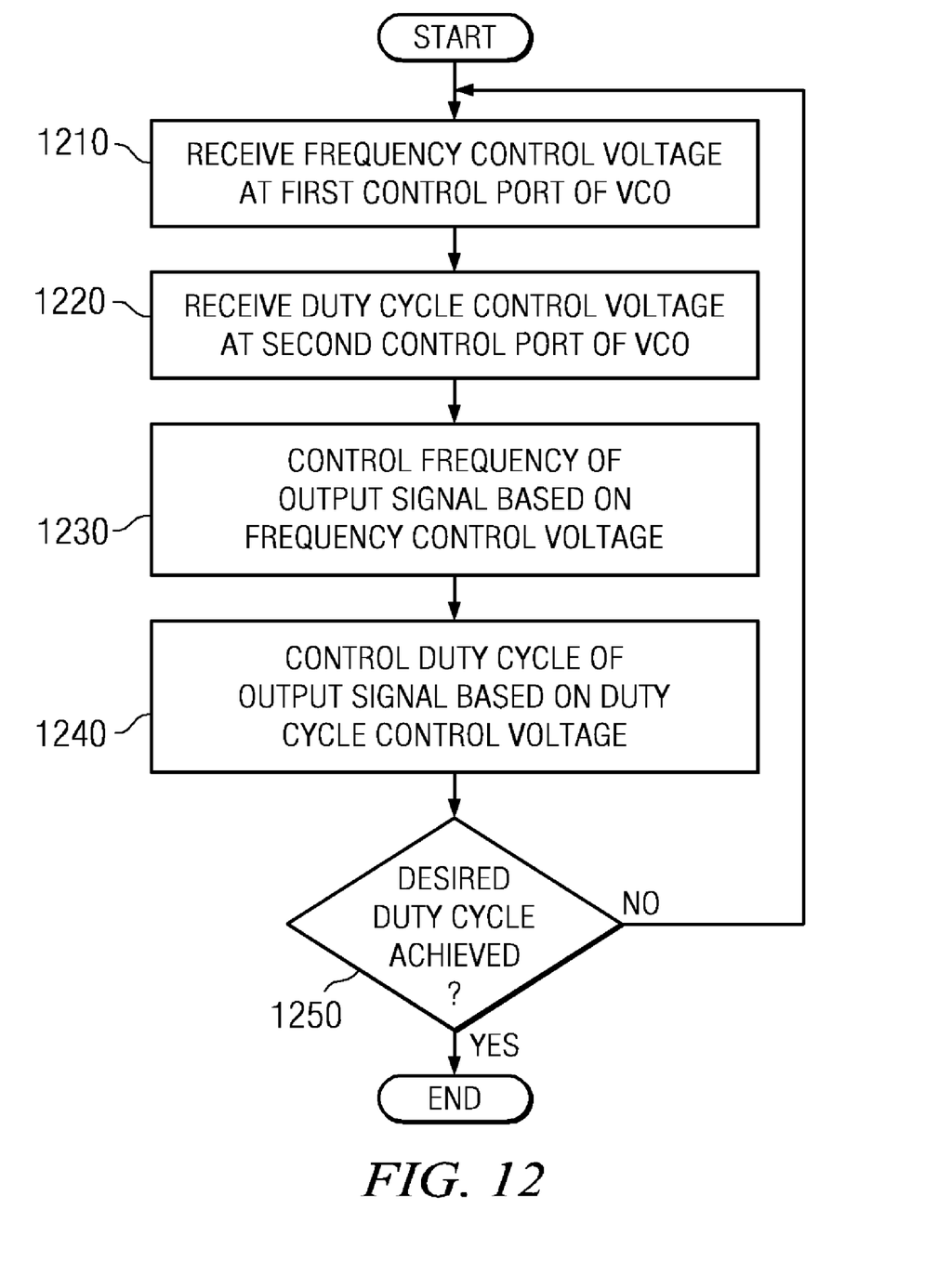
FIG. 12 is a flowchart outlining an exemplary operation for obtaining desired duty cycle of a PLL in accordance with one illustrative embodiment.

FIG. 12 is a flowchart outlining an exemplary operation for obtaining desired duty cycle of a PLL in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks.

These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

Furthermore, the flowchart is provided to demonstrate the operations performed within the illustrative embodiments. The flowchart is not meant to state or imply limitations with regard to the specific operations or, more particularly, the order of the operations. The operations of the flowchart may be modified to suit a particular implementation without departing from the spirit and scope of the present invention.

As shown in FIG. 12, the operation starts with a first control port of a voltage controlled oscillator of the illustrative embodiment receiving a frequency control voltage (step 1210). A second control port of the voltage controlled oscillator receives a duty cycle control voltage (step 1220). The frequency control voltage is used to control a frequency of an output signal of the voltage controlled oscillator (step 1230). The duty cycle control voltage is used to adjust a duty cycle of an output signal of the voltage controlled oscillator toward a desired duty cycle of the output signal (step 1240). Such adjustment of the duty cycle may comprise, for example, increasing a size of a low pulse of the output signal and reducing a size of a high pulse of the output signal in response to an increase in the duty cycle control voltage. Moreover, such adjustment of the duty cycle may comprise reducing a size of a low pulse of the output signal and increasing a size of a high pulse of the output signal in response to a decrease in the duty cycle control voltage. This operation may be performed continuously while the voltage controlled oscillator is in operation. Alternatively, this operation may be terminated in the event that a desired duty cycle of the output signal is achieved (step 1250).

It should be appreciated that the portions of the illustrative embodiments may take the form of an entirely hardware embodiment, an entirely software embodiment or an embodiment containing both hardware and software elements. In one exemplary embodiment, the mechanisms of the illustrative embodiments are implemented in hardware, such as in the duty cycle characterization circuitry described above, but with software control and computation of duty cycle via computing device/controller 230. The software may be provided, for example, in firmware, resident software, microcode, etc.

Furthermore, the portions of the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read-only memory (CD-ROM), compact disk—read/write (CD-R/W) and DVD.

The circuitry as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 13:
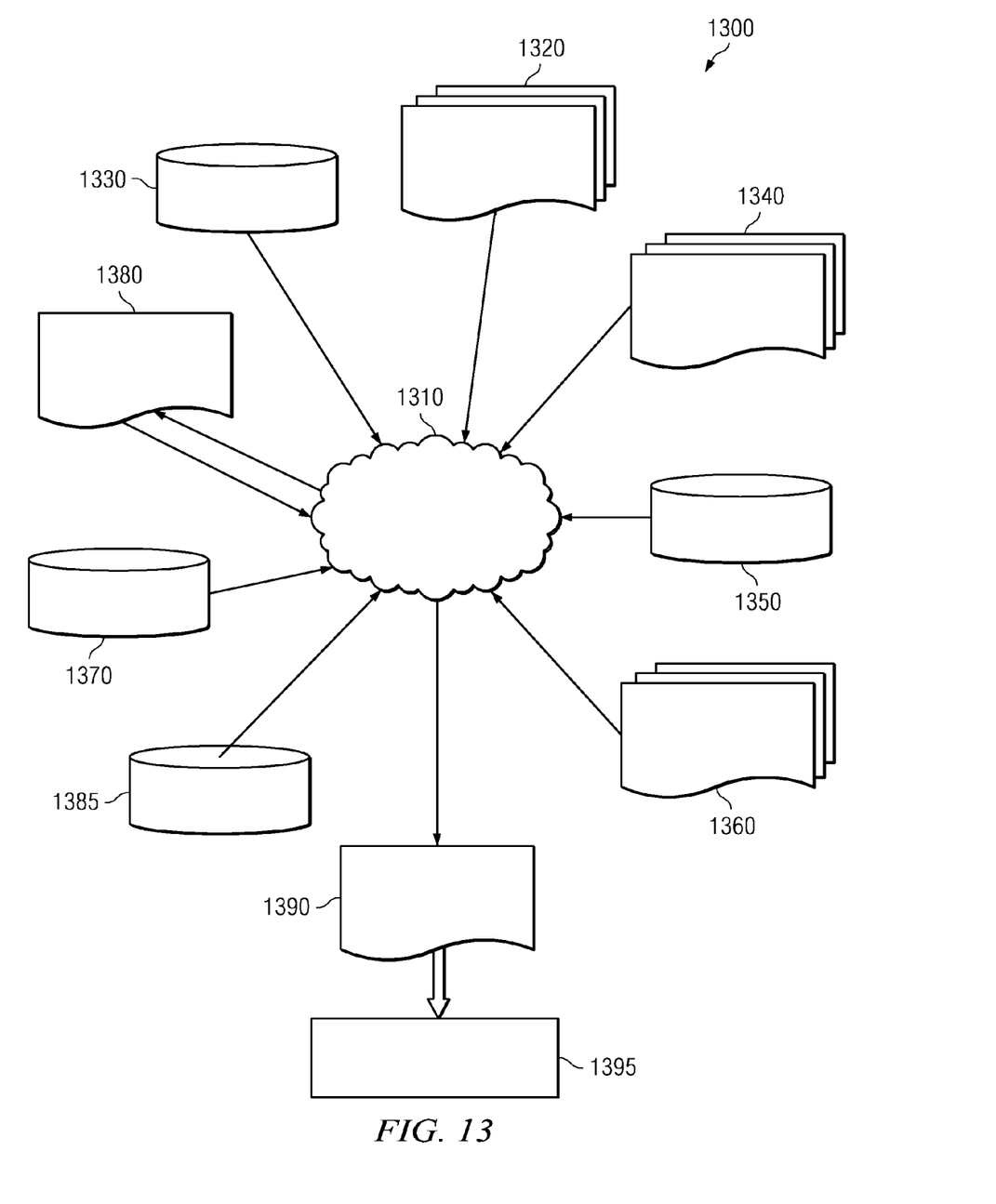
FIG. 13 is a flow diagram of a design process used in semiconductor design, manufacture, and/or test.

FIG. 13 shows a block diagram of an exemplary design flow 1300 used for example, in semiconductor IC logic design, simulation, test, layout, and manufacture. Design flow 1300 includes processes and mechanisms for processing design structures to generate logically or otherwise functionally equivalent representations of the embodiments of the invention shown in FIGS. 3, 5A-5B, and 11. The design structures processed and/or generated by design flow 1300 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 13 illustrates multiple such design structures including an input design structure 1320 that is preferably processed by a design process 13 10. Design structure 1320 may be a logical simulation design structure generated and processed by design process 1310 to produce a logically equivalent functional representation of a hardware device. Design structure 1320 may also or alternatively comprise data and/or program instructions that when processed by design process 1310, generate a functional representation of the physical structure of a hardware device. Whether representing functional and/or structural design features, design structure 1320 may be generated using electronic computer-aided design (ECAD) such as implemented by a core developer/designer. When encoded on a machine-readable data transmission or storage medium, design structure 1320 may be accessed and processed by one or more hardware and/or software modules within design process 1310 to simulate or otherwise functionally represent an electronic component, circuit, electronic or logic module, apparatus, device, or system such as those shown in FIGS. 3, 5A-5B, and 11. As such, design structure 1320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1310 preferably employs and incorporates hardware and/or software modules for synthesizing, translating, or otherwise processing a design/simulation functional equivalent of the components, circuits, devices, or logic structures shown in FIGS. 3, 5A-5B, and 11 to generate a netlist 1380 which may contain design structures such as design structure 1320. Netlist 1380 may comprise, for example, compiled or otherwise processed data structures representing a list of wires, discrete components, logic gates control circuits, I/O devices, models, etc. that describes the connections to other elements and circuits in an integrated circuit design. Netlist 1380 may be synthesized using an iterative process in which netlist 1380 is resynthesized one or more times depending on design specifications and parameters for the device. As with other design structure types described herein, netlist 1380 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1310 may include hardware and software modules for processing a variety of input data structure types including netlist 1380. Such data structure types may reside, for example, within library elements 1330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1340, characterization data 1350, verification data 1360, design rules 1370, and test data files 1385 which may include input test patterns, output test results, and other testing information. Design process 1310 may further include modules for performing standard circuit design processes such as timing analysis, verification, design rule checking, place and route operations, etc.

Design process 1310 employs and incorporates well-known logic and physical design tools such as HDL compilers and simulation model build tools to process design structure 1320 together with some or all of the depicted supporting data structures to generate a second design structure 1390. Similar to design structure 1320, design structure 1390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3, 5A-5B, and 11. In one embodiment, design structure 1390 may comprise a compiled, executable HDL simulation model that functionally simulates the devices shown in FIGS. 3, 5A-5B, and 11.

Design structure 1390 may also employ a data format used for the exchange of layout data of integrated circuits and/or symbolic data format (e.g. information stored in a GDSII (GDS2), GL1, OASIS, map files, or any other suitable format for storing such design data structures). Design structure 1390 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 3, 5A-5B, and 11. Design structure 1390 may then proceed to a stage 1395 where, for example, design structure 1390 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A design structure embodied in a non-transitory machine readable medium for designing, manufacturing, or testing an integrated circuit comprising a voltage controlled oscillator, wherein the design structure resides in the non-transitory machine readable medium as a data format, the design structure, when processed by executing instructions on a computer, provides elements comprising:
    a plurality of first design structure elements representing a plurality of inverters of the voltage controlled oscillator;
    a second design structure element representing a first control port of the voltage controlled oscillator coupled to the plurality of inverters of the voltage controlled oscillator, the first control port being configured to receive a frequency control voltage;
    a third design structure element representing a second control port of the voltage controlled oscillator coupled to the plurality of inverters of the voltage controlled oscillator, the second control port being configured to receive a duty cycle control voltage; and
    at least one fourth design structure element representing at least one duty cycle correction circuit coupled to the plurality of inverters and the second control port, wherein the design structure is configured such that the at least one duty cycle correction circuit adjusts a duty cycle of the output based on the duty cycle control voltage, wherein the design structure is configured such that a frequency of an output signal of the voltage control led oscillator is controlled by the frequency control voltage received via the first control port and a duty cycle of the output signal is controlled by the duty cycle control voltage received via the second control port, and wherein the design structure is configured such that the plurality of inverters are provided in a loop configuration having a plurality of stages, the at least one duty cycle correction circuit comprises a plurality of duty cycle correction circuits, and the duty cycle correction circuits of the plurality of duty cycle correction circuits are directly coupled to every other stage of the loop and are not directly coupled to stages between the every other stages.

2. The design structure of claim 1, wherein the design structure is configured such that the at least one duty cycle correction circuit comprises a pair of transistors, and the pair of transistors adjust a pull up/down rate of at least one inverter in the plurality of inverters.

3. The design structure of claim 1, wherein the design structure is configured such that the at least one duty cycle correction circuit increases a size of a low pulse of the output signal and reduces a size of a high pulse of the output signal in response to an increase in the duty cycle control voltage.

4. The design structure of claim 1, wherein the design structure is configured such that the at least one duty cycle correction circuit reduces a size of a low pulse of the output signal and increases a size of a high pulse of the output signal in response to a decrease in the duty cycle control voltage.

5. The design structure of claim 1, wherein the design structure is configured such that the frequency control voltage is received from a low pass filter of a phase/frequency locked loop and the duty cycle control voltage is received from an operational amplifier of a duty cycle loop.

6. The design structure of claim 5, wherein the design structure is configured such that the operational amplifier of the duty cycle loop generates the duty cycle control voltage based on a desired duty cycle control signal received from a controller.

7. The design structure of claim 6, wherein the design structure is configured such that the operation amplifier of the duty cycle loop further generates the duty cycle control voltage based on an output of the phase/frequency locked loop.

8. A design structure encoded on a non-transitory machine-readable data storage medium as a data format, said design structure comprising elements that when processed in a computer-aided design system generates a machine-executable representation of a phase locked loop circuit comprising a voltage controlled oscillator, wherein said design structure comprises:
    a plurality of first design structure elements representing a plurality of inverters of the voltage controlled oscillator;
    a second design structure element representing a first control port of the voltage controlled oscillator coupled to the plurality of inverters of the voltage controlled oscillator, the first control port being configured to receive a frequency control voltage;
    a third design structure element representing a second control port of the voltage controlled oscillator coupled to the plurality of inverters of the voltage controlled oscillator, the second control port being configured to receive a duty cycle control voltage; and
    at least one fourth design structure element representing at least one duty cycle correction circuit coupled to the plurality of inverters and the second control port, wherein the design structure is configured such that the at least one duty cycle correction circuit adjusts a duty cycle of the output the duty cycle control voltage, wherein the design structure is configured such that a frequency of an output signal of the voltage controlled oscillator is controlled by the frequency control voltage received via the first control port and a duty cycle of the output signal is controlled by the duty cycle control voltage received via the second control port, and wherein the design structure is configured such that the plurality of inverters are provided in a loop configuration having a plurality of stages, the at least one duty cycle correction circuit comprises a plurality of duty cycle correction circuits, and the duty cycle correction circuits of the plurality of duty cycle correction circuits are directly coupled to every other stage of the loop and are not directly coupled to stages between the every other stages.

9. The design structure of claim 8, wherein the design structure is configured such that the at least one duty cycle correction circuit comprises a pair of transistors, and the pair of transistors adjust a pull up/down rate of at least one inverter in the plurality of inverters.

10. The design structure of claim 8, wherein the design structure is configured such that the at least one duty cycle correction circuit increases a size of a low pulse of the output signal and reduces a size of a high pulse of the output signal in response to an increase in the duty cycle control voltage.

11. The design structure of claim 8, wherein the design structure is configured such that the at least one duty cycle correction circuit reduces a size of a low pulse of the output signal and increases a size of a high pulse of the output signal in response to a decrease in the duty cycle control voltage.

12. The design structure of claim 8, wherein the design structure is configured such that the frequency control voltage is received from a low pass filter of a phase/frequency locked loop and the duty cycle control voltage is received from an operational amplifier of a duty cycle loop.

13. The design structure of claim 12, wherein the design structure is configured such that the operational amplifier of the duty cycle loop generates the duty cycle control voltage based on a desired duty cycle control signal received from a controller.

14. The design structure of claim 13, wherein the design structure is configured such that the operation amplifier of the duty cycle loop further generates the duty cycle control voltage based on an output of the phase/frequency locked loop.

15. A hardware description language (HDL) design structure encoded on a non-transitory machine-readable data storage medium as a data format, said HDL design structure comprising elements that when processed in a computer-aided design system generates a machine-executable representation of a phase locked loop circuit comprising a voltage controlled oscillator, wherein said HDL design structure comprises:
a plurality of first design structure elements representing a plurality of inverters of the voltage controlled oscillator;
a second design structure element representing a first control port of the voltage controlled oscillator coupled to the plurality of inverters of the voltage controlled oscillator, the first control port being configured to receive a frequency control voltage;
a third design structure element representing a second control port of the voltage controlled oscillator coupled to the plurality of inverters of the voltage controlled oscillator, the second control port being configured to receive a duty cycle control voltage; and
at least one fourth design structure element representing at least one duty cycle correction circuit coupled to the plurality of inverters and the second control port, wherein the design structure is configured such that the at least one duty cycle correction circuit adjusts a duty cycle of the output signal based on the duty cycle control voltage, wherein the design structure is configured such that a frequency of an output signal of the voltage controlled oscillator is controlled by the frequency control voltage received via the first control port and a duty cycle of the output signal is controlled by the duty cycle control voltage received via the second control port, and wherein the design structure is configured such that the plurality of inverters are provided in a loop configuration having a plurality of stages, the at least one duty cycle correction circuit comprises a plurality of duty cycle correction circuits, and the duty cycle correction circuits of the plurality of duty cycle correction circuits are directly coupled to every other stage of the loop and are not directly coupled to stages between the every other stages.

16. The design structure of claim 15, wherein the design structure is configured such that the at least one duty cycle correction circuit comprises a pair of transistors, and the pair of transistors adjust a pull up/down rate of at least one inverter in the plurality of inverters.

17. The design structure of claim 15, wherein the design structure is configured such that the at least one duty cycle correction circuit increases a size of a low pulse of the output signal and reduces a size of a high pulse of the output signal in response to an increase in the duty cycle control voltage.

18. The design structure of claim 15, wherein the design structure is configured such that the at least one duty cycle correction circuit reduces a size of a low pulse of the output signal and increases a size of a high pulse of the output signal in response to a decrease in the duty cycle control voltage.

19. The design structure of claim 15, wherein the design structure is configured such that the frequency control voltage is received from a low pass filter of a phase/frequency locked loop and the duty cycle control voltage is received from an operational amplifier of a duty cycle loop.

20. A method, implemented in a computer-aided design system comprising at least one processor and at least one memory, for generating a functional design model of a voltage controlled oscillator, said method comprising:
generating, by the at least one processor, a functional computer-simulated representation of a plurality of inverters of the voltage controlled oscillator;
generating, by the at least one processor, a functional computer-simulated representation of a first control port of the voltage controlled oscillator coupled to the plurality of inverters of the voltage controlled oscillator, the first control port being configured to receive a frequency control voltage;
generating, by the at least one processor, a functional computer-simulated representation of a second control port of the voltage controlled oscillator coupled to the plurality of inverters of the voltage controlled oscillator, the second control port being configured to receive a duty cycle control voltage; and
generating, by the at least one processor, a functional computer-simulated representation of at least one duty cycle correction circuit coupled to the plurality of inverters and the second control port, wherein the functional design model is configured such that a frequency of an output signal of the voltage controlled oscillator is controlled by the frequency control voltage received via the first control port and a duty cycle of the output signal is controlled by the duty cycle control voltage received via the second control port, and wherein the functional design model is further configured such that the plurality of inverters are provided in a loop configuration having a plurality of stages, the at least one duty cycle correction circuit comprises a plurality of duty cycle correction circuits, and the duty cycle correction circuits of the plurality of duty cycle correction circuits are directly coupled to every other stage of the loop and are not directly coupled to stages between the every other stages.

* * * * *